(12) United States Patent
Chen et al.

(10) Patent No.: US 11,967,958 B2
(45) Date of Patent: Apr. 23, 2024

(54) DRIVING BUFFER WITH CONFIGURABLE SLEW RATE FOR DATA TRANSMISSION

(71) Applicant: Taiwan Semiconductor Manufacturing Company, Ltd., Hsinchu (TW)

(72) Inventors: Huan-Neng Chen, Taichung (TW); Chang-Fen Hu, Hsinchu (TW); Shao-Yu Li, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 49 days.

(21) Appl. No.: 17/538,154

(22) Filed: Nov. 30, 2021

(65) Prior Publication Data
US 2022/0352880 A1 Nov. 3, 2022

Related U.S. Application Data

(60) Provisional application No. 63/182,007, filed on Apr. 30, 2021.

(51) Int. Cl.
H03K 5/01 (2006.01)
H03K 19/20 (2006.01)
H03K 5/00 (2006.01)

(52) U.S. Cl.
CPC .............. H03K 5/01 (2013.01); H03K 19/20 (2013.01); *H03K 2005/00013* (2013.01)

(58) Field of Classification Search
CPC . H03K 5/01; H03K 19/20; H03K 2005/00013
USPC ........................................................ 327/109
See application file for complete search history.

(56) References Cited

U.S. PATENT DOCUMENTS

| | | | | |
|---|---|---|---|---|
| 5,862,390 A | * | 1/1999 | Ranjan | H03K 19/00361 710/52 |
| 6,097,219 A | * | 8/2000 | Urata | H03K 19/0005 326/87 |
| 6,232,814 B1 | * | 5/2001 | Douglas, III | H03K 19/0005 327/281 |
| 6,452,428 B1 | * | 9/2002 | Mooney | H04L 5/1423 326/82 |
| 6,704,818 B1 | * | 3/2004 | Martin | H03K 17/164 713/401 |

(Continued)

OTHER PUBLICATIONS

Shin et al., "Slew-Rate-Controlled Output Driver Having Constant Transition Time Over Process, Voltage, Temperature, and Output Load Variations," IEEE Transactions on Circuits and Systems—II: Express Briefs, vol. 54, No. 7, Jul. 2007; pp. 601-605.

*Primary Examiner* — Ryan Jager
(74) *Attorney, Agent, or Firm* — Merchant & Gould P.C.

(57) ABSTRACT

In some embodiments, digital logic components, such as those found in standard cells in integrated circuit devices, are used to synthesize signals with controllable waveforms that result in transmitted signals that meet certain requirements, such as above-threshold high openings and below-threshold over/under-shooting. In some embodiments, driving buffers with logic controls and delay chains are used to achieve controllable slew rates at rising and falling edges to minimize over/under shooting behavior in signals. In some embodiments, control logic and delay chains produce controllable rising/falling "stair-type" edges to obtain optimized damping waveform.

20 Claims, 10 Drawing Sheets

(56) References Cited

U.S. PATENT DOCUMENTS

| | | | |
|---|---|---|---|
| 6,744,287 B2* | 6/2004 | Mooney | H04L 25/028 |
| | | | 326/82 |
| 6,864,726 B2* | 3/2005 | Levin | H03K 17/165 |
| | | | 327/104 |
| 7,151,392 B2* | 12/2006 | Lee | G11C 7/1057 |
| | | | 326/82 |
| 7,190,719 B2* | 3/2007 | Roy | H04L 25/03885 |
| | | | 375/229 |
| 7,215,144 B2* | 5/2007 | Mitby | H04L 25/0288 |
| | | | 326/82 |
| 7,777,538 B2* | 8/2010 | Abel | H03K 5/01 |
| | | | 327/295 |
| 8,395,411 B2* | 3/2013 | Diffenderfer | H04L 25/0286 |
| | | | 327/170 |
| 8,917,131 B2* | 12/2014 | Song | G11C 16/24 |
| | | | 327/170 |
| 9,129,694 B2* | 9/2015 | Song | H03K 19/018528 |
| 9,444,462 B2* | 9/2016 | Chaung | H03K 19/018521 |
| 9,461,634 B2* | 10/2016 | Jung | H03K 5/01 |
| 10,141,931 B2* | 11/2018 | Choi | H03K 3/011 |
| 10,931,278 B2* | 2/2021 | Morinaka | H03K 17/163 |
| 2004/0212399 A1* | 10/2004 | Mulligan | G06F 1/3203 |
| | | | 326/90 |
| 2007/0210832 A1* | 9/2007 | Abel | H03K 5/01 |
| | | | 326/93 |
| 2012/0086470 A1* | 4/2012 | Diffenderfer | H04L 25/0286 |
| | | | 326/30 |
| 2012/0119792 A1* | 5/2012 | Wang | H04L 25/0278 |
| | | | 327/108 |
| 2013/0147532 A1* | 6/2013 | Song | H03K 19/018585 |
| | | | 327/170 |
| 2014/0176197 A1* | 6/2014 | Shon | H03K 3/01 |
| | | | 327/108 |
| 2018/0107774 A1* | 4/2018 | Fredenburg | G06F 30/367 |
| 2020/0186134 A1* | 6/2020 | Liu | H03K 5/133 |

* cited by examiner

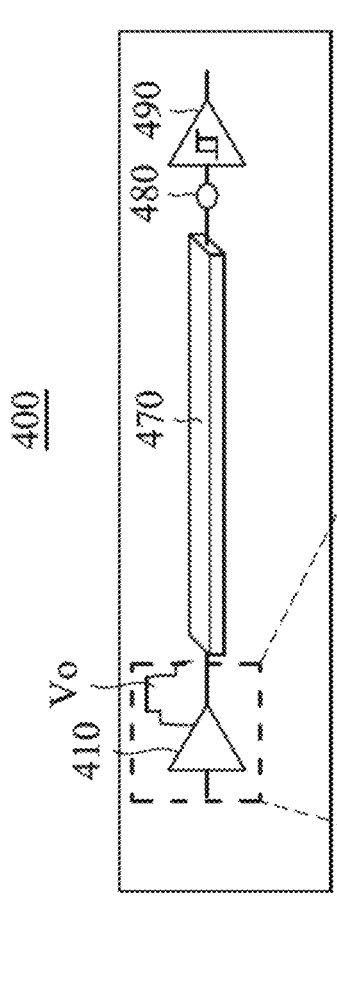
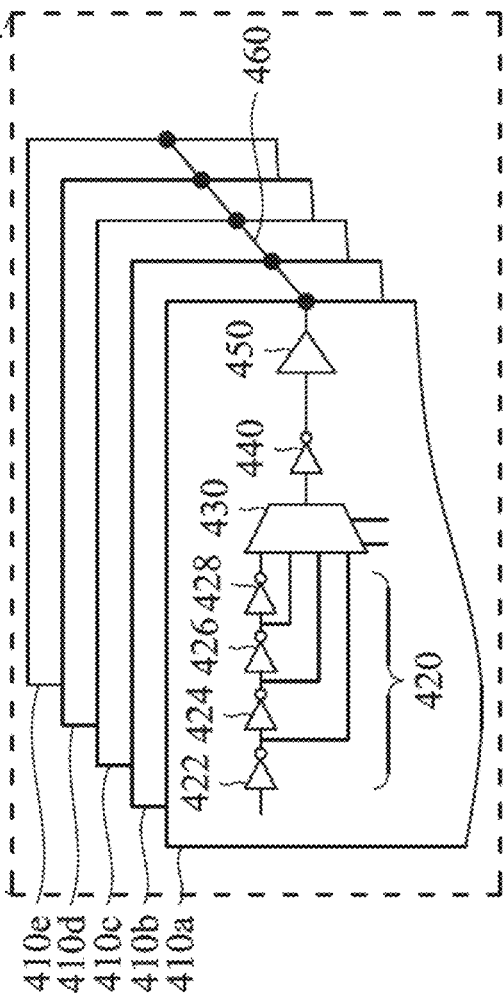
FIG. 4A
FIG. 4B

DRIVING BUFFER WITH CONFIGURABLE SLEW RATE FOR DATA TRANSMISSION

CROSS-REFERENCE TO RELATED APPLICATIONS

The present application claims the benefit of U.S. Provisional Patent Application No. 63/182,007, titled "SYNTHESIZABLE BUFFER WITH CONTROLLABLE SLEW RATE FOR DATA TRANSMISSION" and filed Apr. 30, 2021. The disclosure of U.S. Provisional Patent Application No. 63/182,007 is hereby incorporated by reference in its entirety.

BACKGROUND

This disclosure relates generally to a method and system for data transmission, and more particularly to digital data transmission in semiconductor devices such as integrated circuits.

For high speed data communication in integrated circuits (IC), it is important to minimize error rates of signals transmitted. In certain types of IC devices, for example in certain three-dimensional IC (3DIC) devices, certain long transmission paths, such as channels between dies, can significantly distort signal waveforms. Signal distortions can result in high error rates in data transmission. Efforts are ongoing to reduce data transmission error rates due to signal distortion.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A illustrates an integrated circuit device according to some embodiments.

FIG. 4B illustrates a multi-bit driver circuit for providing signals with rising and falling edges of controllable slew rate according to some embodiments.

DETAILED DESCRIPTION

Figures 1A, 1B:
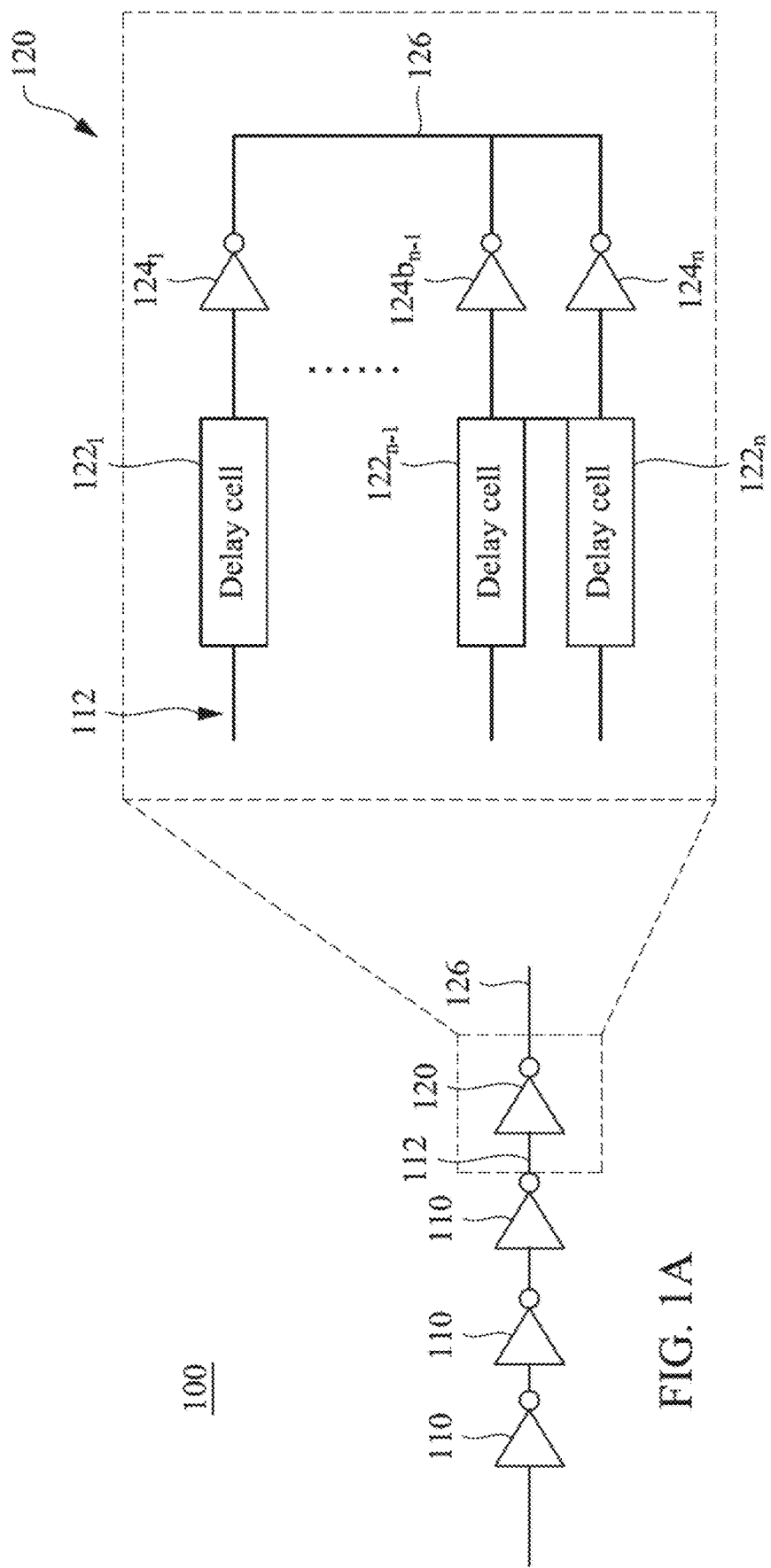
FIG. 1A is a schematic illustration of a driving buffer chain according to some embodiments.
FIG. 1B is a schematic illustration of the details of a driving buffer in a stage (in this example the last stage) of the driving buffer chain shown in FIG. 1A.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-speed data transmission with low error rate is important for integrated circuits. In certain types of integrated circuit devices, relatively long (e.g., on the order of 1000 µm or more) data transmission paths are employed. For example, in certain three-dimensional integrated circuits (3DICs), multiple semiconductor dies are interconnected in the packaged together to form an integrated circuit device. Examples of such integrated circuit devices include Chip-on-Wafer-on-Substrate (CoWoS), Integrated FanOut (InFO), and System Integrated Chips (SoIC). In some of these integrated circuit devices, semiconductor dies are arranged edge-to-edge. In certain arrangements, the edge-to-edge distance is on the order of 1000 µm, and the lengths inter-die connections can be on the water of several thousand micrometers (e.g., 4000 µm). Data transmission paths (or traces) of such distances can cause significant distortions to signals being transmitted such that the eye openings in the eye diagrams for the transmitted signals with rising and falling edges are significantly diminished. Such diminishment becomes more severe as the lengths of the traces increase. Although the eye-openings in the eye diagrams can be increased in some cases by increasing the driving power for the signals, for example, by increasing the sizes (e.g., number of fingers) of the driving buffers, such increasing power can lead to over/under-shooting waveforms in the transmitted signals. While certain driving buffer circuit designs, such as driving buffers with capacitive feedbacks, may improve the way forms of the transmitted signals with rising and falling edges, such designs are difficult to implement in high density integrated circuits for a variety of reasons, including spatial constraints imposed by compact area and high channel density requirements.

In some embodiments, digital logic components, such as those found in standard cells in integrated circuit devices, are used to synthesize signals with controllable waveforms that result in transmitted signals that meet certain requirements, such as above-threshold high openings and below-threshold over/under-shooting. In some embodiments, driving buffers with logic controls and delay chains are used to achieve controllable slew rates at rising and falling edges to minimize over/under shooting behavior in signals. In some embodiments, control logic and delay chains produce controllable rising/falling "stair-type" edges to obtain optimized damping waveform.

In some embodiments, a driving buffer includes transistors (e.g., fin field-effect transistors (FinFETs)) of sizes (e.g., number of fingers) selected to produce the height of the respective "stair heights" in the "stair-type" rising and falling edges. For example, in some embodiments, a voltage step of a certain height in the rising edge of the output generated by a driving buffer can be produced by transistors of a certain size (e.g., 16 fingers); in general, voltage step height can be controlled by the ratio of switched-on fingers and all fingers.

In some embodiments, a driving buffer capable of generating configurable output waveforms includes multiple unit cells each including a delay chain of multiple delay units (i.e., logical devices such as inverters), a selector (e.g., a multiplexer) connected and configured to select a desired number of delay units to generate a signal with a desired amount of delay, and a buffer configure to generate an output of a desired signal amplitude (e.g., voltage amplitude). The output signal of the unit cell, therefore, is of a given height and a selected amount of delay. In some embodiments, the amplitude of the output signal for each unit cell is different from the amplitude of the output signal of at least one of the remaining unit cells. The combined output from the unit cells, in some embodiments, is a signal with stepped rising and falling edges; the width of each step can be tuned by selecting the number of delay units in the appropriate in the cell, and the height of each step can be tuned by selecting the appropriate unit cell(s). The driving buffer is thus capable of generating signals with rising and falling edges of tunable waveforms.

Referring to FIG. 1A, a digital delay line 100 in some embodiments includes multiple delay elements 110 connected in series, followed by a driving buffer 120 configured to receive at an input 112 the output of the serial combination of the delay elements 110 and in response output signals with rising and falling edges of configurable waveforms. The delay elements 110 in the embodiment shown in FIG. 1A are inverters but can be any element that produces a suitable delay. For example, an AND cell or an OR cell can be used.

In some embodiments, as shown in FIG. 1B, a driving buffer 120 capable of generating signals with rising and falling edges of configurable waveforms includes multiple branches, each of which (the ith branch) including a delay cell 122$_i$ followed by a driver 124$_i$. In some embodiments, one or more of the drivers 124$_i$ can be tri-state buffers so that each branch can be turned on and off as desired. The output 126 of the driving buffer 120 is thus a composite signal of the signals from the branches of the driving buffer 120.

In some embodiments, each delay cell 122$_i$ includes one or more digital cells, such as inverter cells, AND cells, or OR cells. The amount of time delay produced by each cell depends on the size of the cell. The size of the cell in some embodiments is determined by the sizes of the transistors, and generally, the delay time decreases with the cell size. For example, delay times will be lower with process shrinkage, and the delay time in some examples is lower than 10 ps when process node is smaller than 16 nm.

Figure 2A:
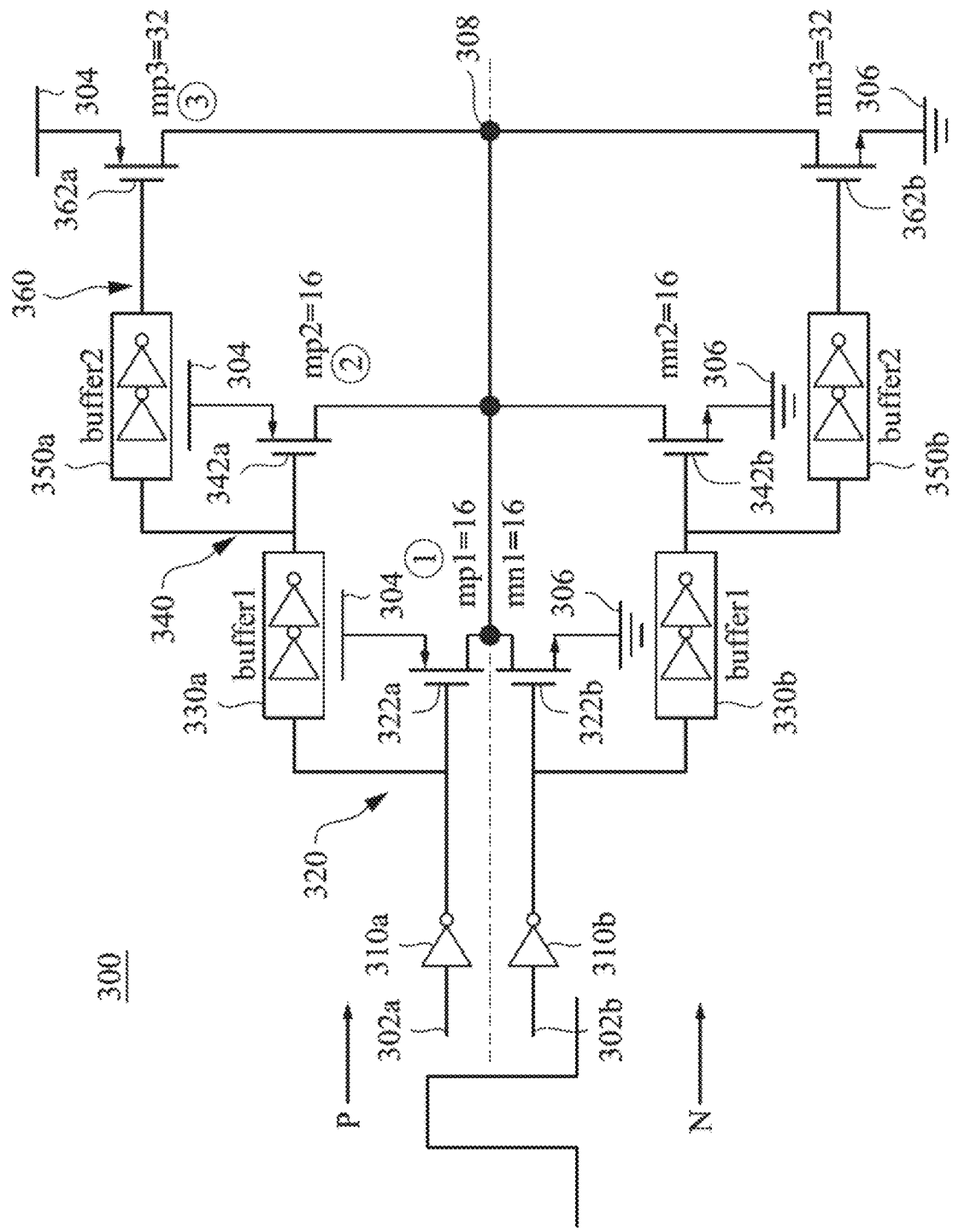
FIG. 2A illustrates a circuit for a driving buffer for synthesizing signals with rising and falling edge with controllable slew rate according to some embodiments.

A specific example 300 of a driving buffer 120 capable of generating signals with rising and falling edges of configurable waveforms is shown in FIG. 2A. The driving buffer 300 in this example includes two complementary halves—P-side and N-side. The inputs 302*a*, 302*b* are connected respectively to inverters 310*a*, 310*b*, the outputs of which are connected to the gates of a pair 320 of transistors 322*a*, 322*b*, which are connected to each other in series between a voltage supply 304 and the ground 306. The outputs from inverters 310*a*, 310*b* are also connected to the gates of a pair 340 of transistors 342*a*, 342*b*, through respective delay buffers 330*a*, 330*b*; the transistors 342*a*, 342*b* are connected to each other in series between the voltage supply 304 and the ground 306. The outputs from the delay buffers 330*a*, 330*b* are also connected to the gates of a pair 360 of transistors 362*a*, 362*b*, through respective delay buffers 350*a*, 350*b*; the transistors 362*a*, 362*b* are connected to each other in series between the voltage supply 304 and the ground 306. The pairs 320, 340, 360 of transistors have a common output 308 as the output of the driving buffer 300.

In this particular example, the first pair 320 of transistors each have a size of 16 fingers; the second pair 340 of transistors each have a size mp2, mn2 of 16 fingers; and the third pair 360 of transistors each have the size mp3, mn3 of 32 fingers. As explained below, the sizes of the transistors affect the shapes of waveforms generated by the driving buffer 300.

In operation, each transistor in the driving buffer 300 drives a respective current as a function of its gate voltage. As the input signal arrives at different pairs 320, 340, 360 of transistors at different times due to the delay puffers 330, 350, the pairs 320, 340, 360 of transistors begin generating respective currents at different times. The combined current at the output 308, therefore, will have an amplitude that stepwise increases in response to the rising edge of the input signal. Likewise, the Paris 320, 340, 360 of transistors ceases to generate respective currents at different times in response to the falling edge of the input signal, and the combined current at the output 308 will have an amplitude that stepwise decreases in response to the falling edge of the input signal. The voltage at the load (not shown) connected to the output 308 were thus have a waveform having a stepwise increasing rising edge and a stepwise decreasing falling.

Figure 2B:
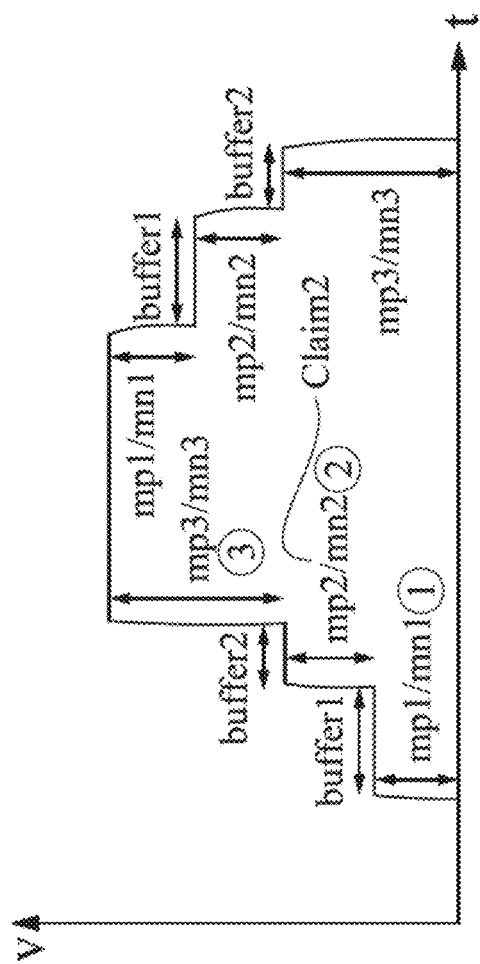
FIG. 2B illustrates a signal generated by the driving buffer circuit shown in FIG. 1A according to some embodiments.
Figure 2C:
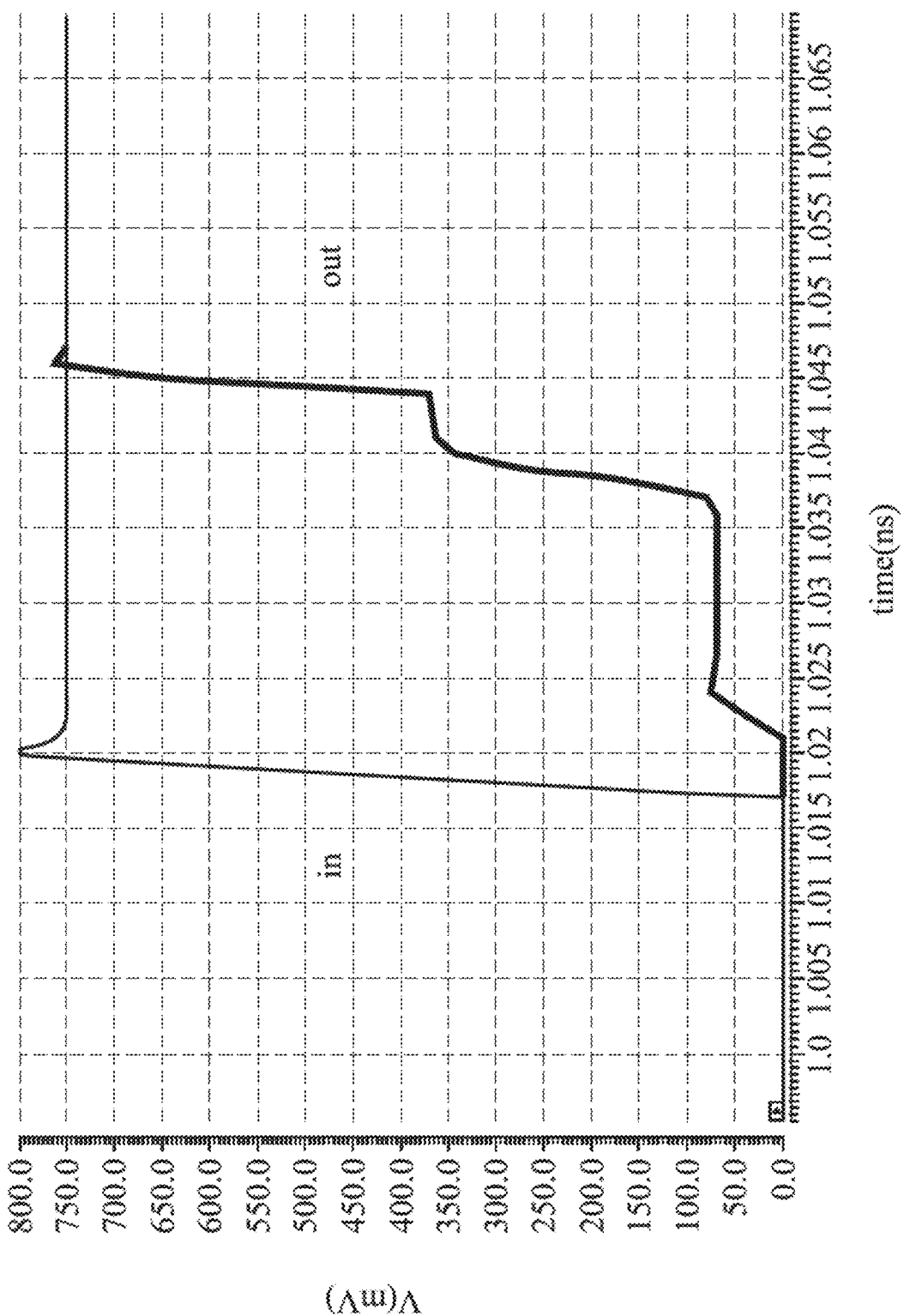
FIG. 2C illustrates the rising edge of the input signal applied to the driving buffer circuit shown in FIG. 1A and the rising edge of the output signals with rising and falling edges generated by the driving buffer circuit in response to the input signal with rising and falling edges according to some embodiments.
Figure 2D:
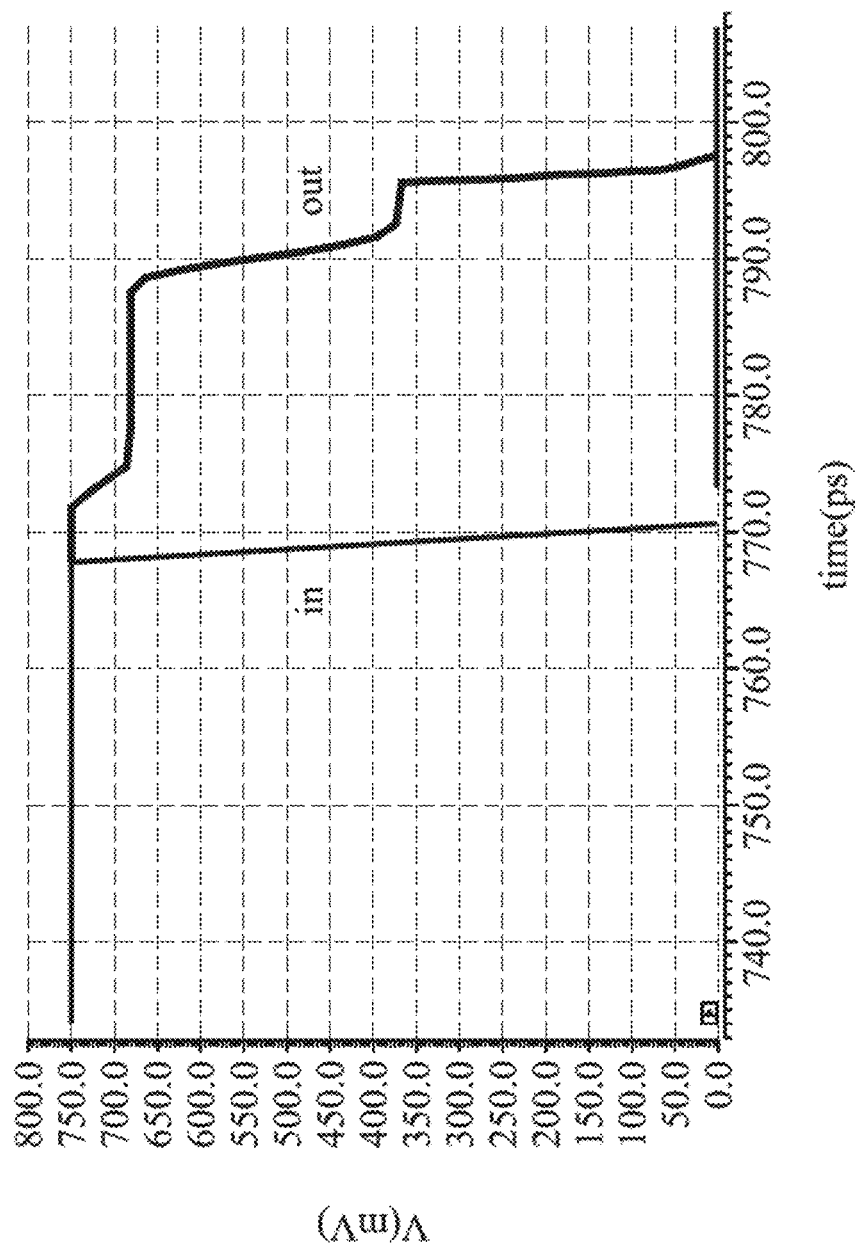
FIG. 2D illustrates the falling edge of the input signal applied to the driving buffer circuit shown in FIG. 1A and the falling edge of the output signals with rising and falling edge generated by the driving buffer circuit in response to the input signal according to some embodiments.

In some embodiments, as shown in FIG. 2B, a driving buffer of the kind shown in FIG. 2A can generate output signals with rising and falling edges of configurable shapes of rising and falling edges, and thus slew rates. In the example waveform shown in FIG. 2B, the rising edge (shown in more detail in FIG. 2C) of the signal, in response to an input signal of a square wave form, is stair-shaped including three steps: the first step has a height determined by the size of the first pair 320 of transistors; the second step begins after a delay by the first delay buffers 330*a*, 330*b*, and as a height determined by the size of the second pair 340 of transistors; and the third step begins after a delay by the second delay buffers 350a, 350b, and as a height determined by the size of the third pair 360 of transistors. The following edge of the output signal of the driving buffer likewise has steps with widths and heights determined by the delay buffers and the sizes of the transistors, as shown in FIGS. 2B and 2D.

Figure 3:
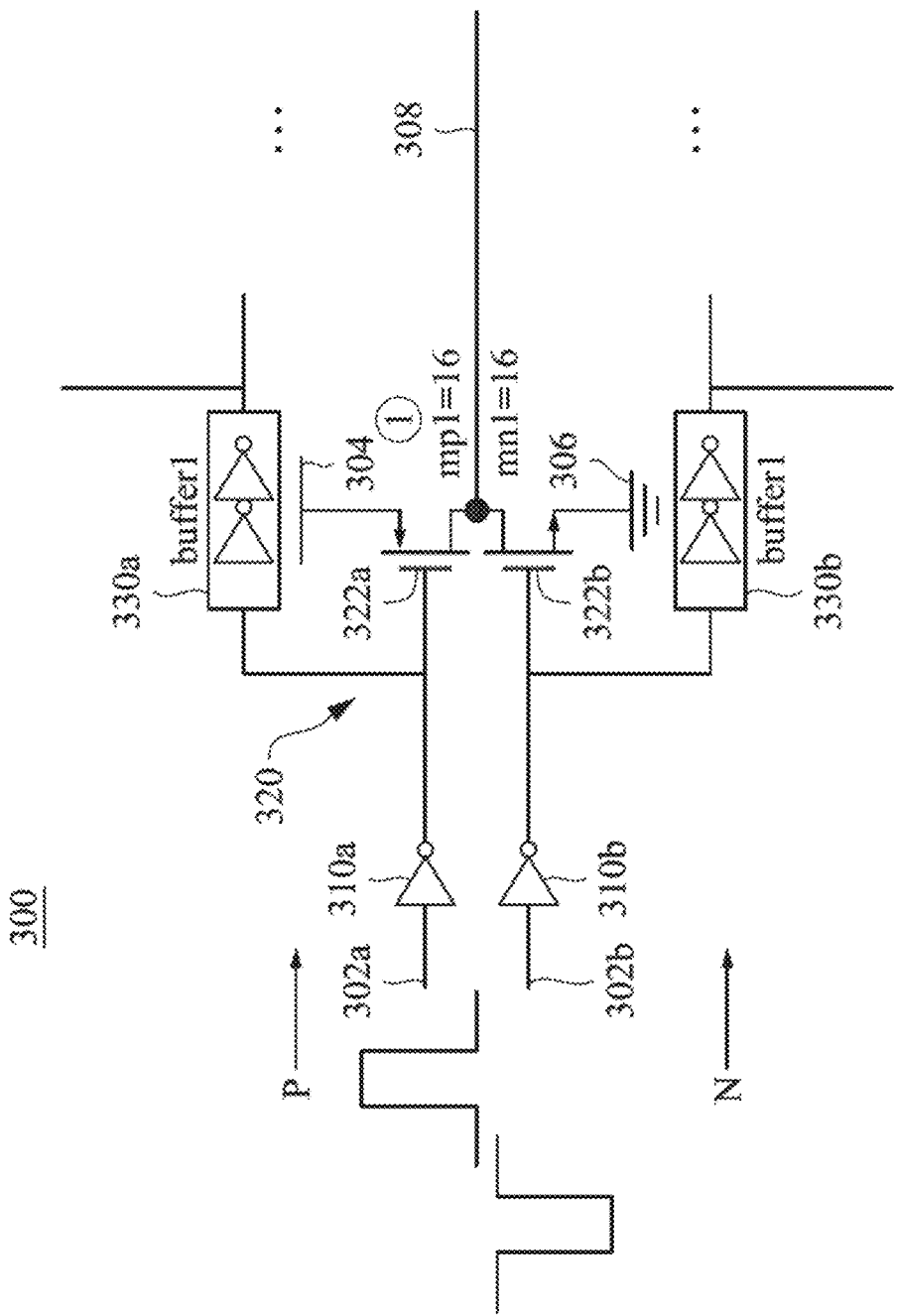
FIG. 3 illustrates signals with rising and falling edges of non-identical timing applied to the inputs of the driving buffer circuit shown in FIG. 1A according to some embodiments.

In some embodiments, the components on the N-side in the example circuit shown in FIG. 1A are symmetrical to the corresponding components on the P-side. That is, the delay buffers 330a and 330b produce substantially the same amount of time delay as each other; the delay buffers 350a and 350b produce substantially the same amount of time delay as each other; the transistors in each pair 320, 340, 360 are of substantially the same size as each other. However, each component can be independent in characteristics from any other component as specific applications dictate. Furthermore, as shown in FIG. 3, in some embodiments, signals with rising and falling edges of non-identical timing can be applied to the inputs 302a, 302b of the driving buffer 300.

In some embodiments, a driving buffer is capable of generating signals with rising and falling edges with tunable waveforms. As an example, in the integrated circuit device 400 shown in FIG. 4A, the driving buffer 410 is capable of generating signals with controllable rising and falling edges, and thus controllable slew rate. As shown in more detail in FIG. 4B, the driving buffer 410 includes multiple (in this example, five) unit cells 410a, b, c, d, e. Each cell (using the example of in this cell 410a) includes a delay cell 420, which includes multiple (in this example, four) delay elements 422, 424, 426, 428 connected in series. The delay elements in this example are inverter cells but can be any other elements that produce requisite delays. Each unit cell further includes a selector which in this example is a multiplexer 430. The inputs of the multiplexer 430 are connected to the outputs of the respective delay elements 422, 424, 426, 428. The selector inputs DT0 and DT1 selects one of the inputs of the multiplexer as the output of the multiplexer 430. Thus the output of the multiplexer 430 is the input to the delay cell 420 delayed by one, two, three, or four delay elements 422, 424, 426, 428, depending on the setting of the selector inputs DT0 and DT1. Each unit cell further includes a buffer 450, with its input connected to the output of the multiplexer 430, in this example through an inverter 440. The outputs of the buffers 450 in the unit cells 410a, b, c, d, e are connected together to form the output 460 of the driving buffer 410. Each unit cell 410a, b, c, d, e can be set to a desired delay time by the appropriate settings of DT0 and DT1; the buffer 450 in some embodiments have different driving capacities for different unit cells. The driving buffer 410 thus can be configured to generate output signals with rising and falling edges with configurable shapes of rising and falling edges, and thus controllable slew rates.

Referring again to FIG. 4A, the integrated circuit device 400 further includes a data transmission path 470 connected at the input end to the output of the driving buffer 410 and output end to the receiving portion of an integrated device. In some embodiments, the receiving portion includes a signal conditioning circuit such as a PID (proportional-integral-derivative) control circuit 480 followed by a signal generating device, such as a Schmitt trigger 490.

Figure 5A:
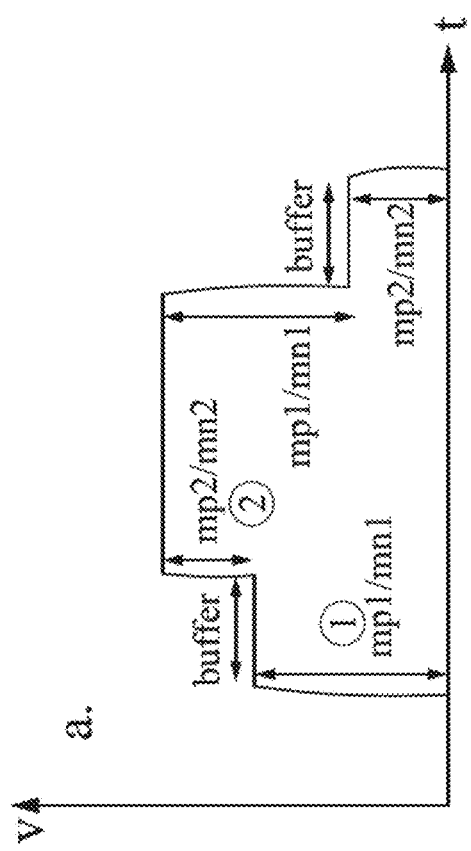
FIG. 5A illustrates a signal with a single step in the rising and falling edges generated by a driving buffer according to some embodiments.
Figure 5B:
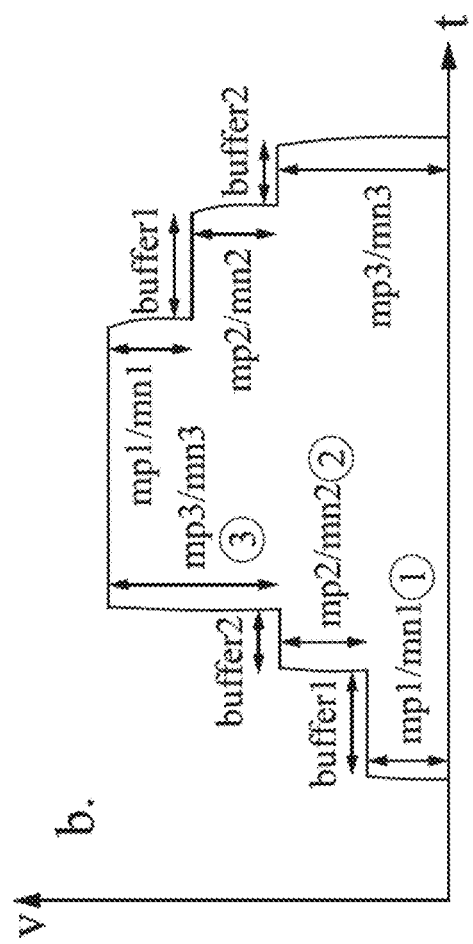
FIG. 5B illustrates a signal with two steps in the rising and falling edges generated by driving buffer according to some embodiments.

With the configuration of the driving buffer 410 in FIG. 4B, signals with rising and falling edges with a variety of shapes of rising and falling edges can be generated. As shown in FIGS. 5A and 5B, poses with different number of steps, and different step heights, in the rising and falling edges can be generated. For example, if three of the unit cells in the driving buffer 410 are turned off, for example by turning off the tri-state buffer 450, signals Vo with two steps in the rising and falling edges can be generated, as shown in FIG. 5A; if two of the unit cells in the driving buffer 410 are turned off, for example by turning off the tri-state buffer 450, signals with three steps in the rising and falling edges can be generated, as shown in FIG. 5B.

Figure 6:
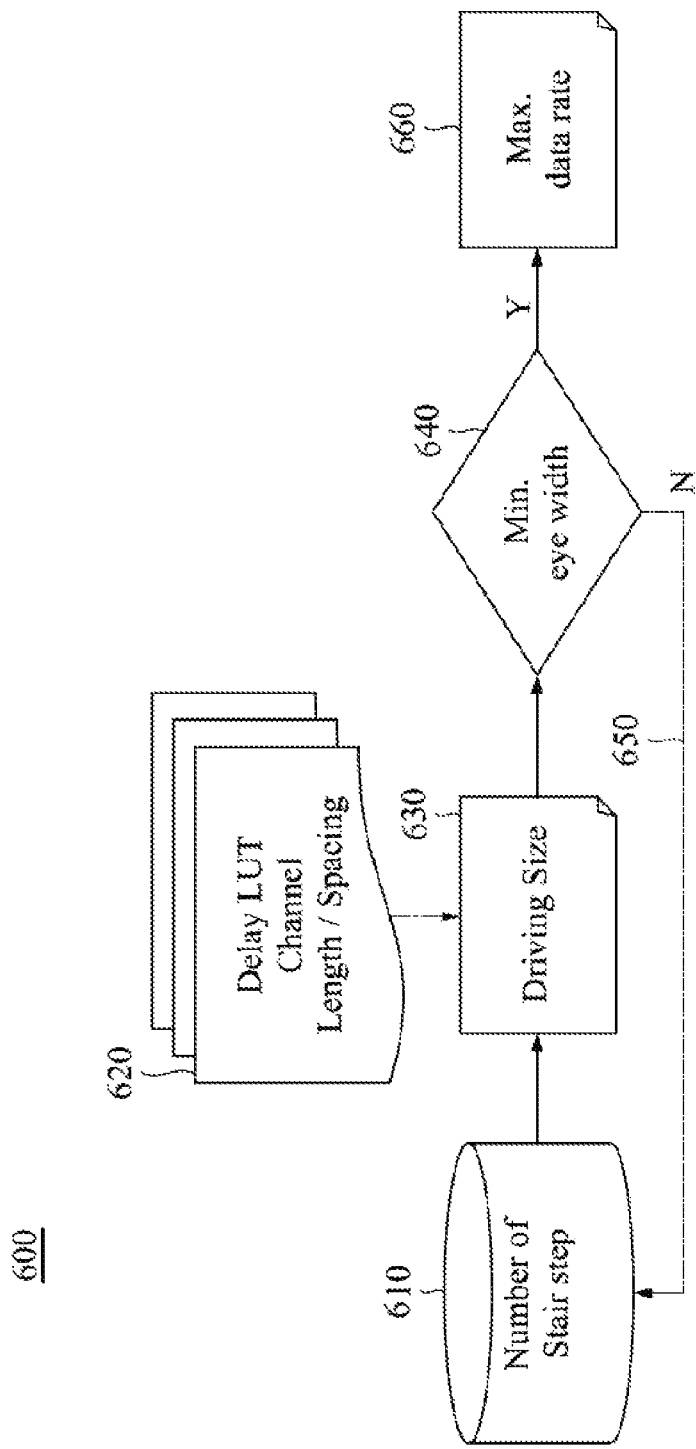
FIG. 6 shows a decision process flow for designing a driving buffer for synthesizing signals rising/falling was controllable slew rate according to some embodiments.

In some embodiments, parameters of buffer drivers, such as those shown in FIGS. 3 and 4B, can be systematically selected or optimized by following certain algorithms, which can be executed by computers programmed to carry out such selection or optimization. As an example, as shown in FIG. 6, a process 600 for optimizing drive buffer parameters begins with choosing number of stair steps (e.g., two steps) in the rising and falling edges of the signals with rising and falling edges to be generated. Next, delay time is determined 620, for example, using a lookup table (LUT) based on channel length (i.e., the length of data transmission path) and spacing, and the drive size (e.g., number of fins) is determined 630 based on parameters including channel length. For example, in some embodiments, a channel length of 1000 μm may correspond to a delay time of 30 ps and fin number of 32. Next, a transmitted signal is obtained (e.g., by simulation) using the parameters for the delay cells (e.g., delay elements 422, 424, 426, 428, multiplexer 430, and buffer 450, an eye diagram constructed from the signal obtained, and a determination is made 640 as to whether the eye-opening is equal to or greater than the minimum required size. If the minimum requirement is not met, the process is repeated 650 with a different number of stair steps 610; if the minimum requirement is met, the design parameters can be set and the maximum data rate can be calculated from the delay time and eye-opening width.

Figure 7:
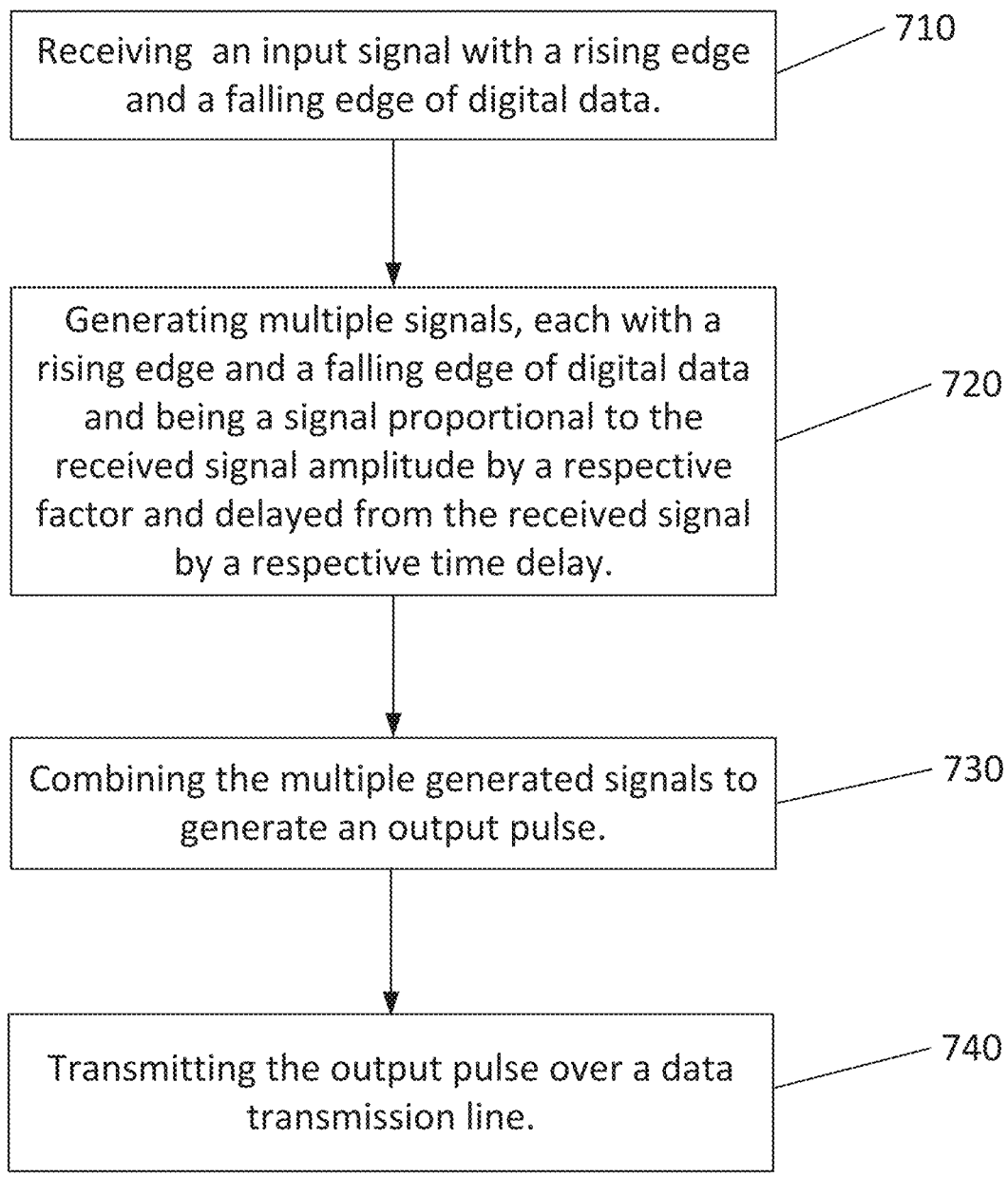
FIG. 7 outlines a method of transmitting a signal according to some embodiments.

In some embodiments, as outlined in FIG. 7, a method 700 of transmitting a signal includes receiving 710 an input signal with a rising edge and a falling edge of digital data; generating 720 a plurality of signals, each with a rising edge and a falling edge of digital data and being a signal proportional to the received signal amplitude by a respective factor and delayed from the received signal by a respective time delay; combining 730 the plurality of generated signals to generate an output signal; and transmitting 740 the output signal over a data transmission line. At least some portions of the process of design and/or fabrication of electronic device (e.g., integrated circuit device) described in some embodiments are performed by a computerized system such as a system with electronic design automation (EDA) tools in some embodiments. The method in some embodiments are encoded in programs which are stored The example driving buffers and methods described above, by synthesizing shapes of the rising and falling edges, and thus controlling slew rates, compensate the distortion by the data transmission paths to produce transmitted signals of large eye-openings in eye-diagrams without large over/under shooting, resulting in low inter-symbol interference (ISI). The driver buffer circuit in some embodiments a fully digital cells without the need for capacitive feedback, making the design compatible with standard cell height circuits. The modular design of the driving buffer makes the design scalable and provides flexibility for trace routing the integrated circuit design.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A driving buffer, comprising:
an input configured to receive an input signal with a rising edge or falling edge of digital data;
an output; and
a plurality of delay paths, each connected between the input and the output and being configured to delay the input signal by a respective amount of time and including a driver having a respective gain, at least two of the delay paths being configured to delay the input signal by different amounts of time from each other
wherein at least two of drivers connected to respective delay cells each comprise a transistor, the transistors in the at least two drivers having different sizes from each other.

2. The driving buffer of claim 1, wherein:
each of the plurality of delay paths includes: a delay cell having a first input and a first output, the first input being connected to the input of the driving buffer and configured to delay the input signal by a respective amount of time; and
the driver in each delay path has a second input and a second output, the second input being connected to the first output of the delay cell, and the second output being connected to the output of the driving buffer, the driver being configured to provide at the second output of the driver a signal of a respective amplitude.

3. The driving buffer of claim 2, wherein at least two of drivers connected to respective delay cells are configured to provide different amplitudes from each other.

4. The driving buffer of claim 2, wherein the driver in each of the plurality of delay paths comprises a transistor of respective size.

5. The driving buffer of claim 4, wherein the transistors having different sizes from each other each comprises a fin field-effect transistor ("FinFET") having a respective number of fingers, the numbers of fingers for the FinFETs are different from each other.

6. The driving buffer of claim 2, wherein the delay cell in at least one of the delay paths comprises a plurality of logic gates connected in series.

7. The driving buffer of claim 2, wherein the delay cell in at least one delay path of the plurality of delay paths is configured to delay the input signal by a controllable amount of time.

8. The driving buffer of claim 7, wherein the delay cell in the at least one delay path comprises:
a plurality of delay elements forming a plurality of combinations, each configured to delay the input signal by a different amount of time;
a selector configured to selectively connect the plurality of combinations to the first output of the delay cell.

9. The driving buffer of claim 8, wherein the plurality of delay elements are connected in a serial combination, and the selector is configured to selectively connect a subset of the plurality of delay elements between input and output of the at least one delay path.

10. The driving buffer of claim 9, wherein the plurality of delay elements each comprise a logic gate having a third input and a third output, and the selector comprises a multiplexer having a plurality of signal inputs, a fourth output and at least one select input, wherein each of the signal inputs of the multiplexer is connected to the third output of a respective one of the logic gates, and the output of the multiplexer is connected to the fourth output of the at least one delay path.

11. The driving buffer of claim 2, wherein the driver in at least one of the plurality of delay paths comprises a switchable driver.

12. The driving buffer of claim 2, wherein the driver in at least one of the plurality of delay paths comprises a tri-state buffer.

13. The driving buffer of claim 1, wherein the plurality of delay paths are configured to generate at the output of the driving buffer, in response to a signal applied to the input of the driving buffer and having a waveform with a substantially straight rising edge, an output signal have a waveform with a stepped rising edge.

14. The driving buffer of claim 1, wherein at least one of the plurality of delay paths is switchably connected between the input and output of the driving buffer.

15. An integrated circuit device, comprising:
a first integrated circuit portion comprising a first plurality of semiconductor devices and configured to generate an output signal at an output point;
a second integrated circuit portion comprising a second plurality of semiconductor devices and configured to receive signals at an input point;
a data communication path having an input end and an output end, the output end being connected to the input point of the second integrated circuit portion; and
a driving buffer comprising an input connected to the output point of the first integrated circuit portion, and an output connected to the input end of the data communication path, the driving buffer being configured to generate at the output of the driving buffer, substantially without using capacitively feedback, an output signal have a waveform with a stepped rising edge in response to a signal applied to the input of the driving buffer and having a waveform with a substantially straight rising edge, wherein the driving buffer further comprises a plurality of delay paths, each connected between the input and output of the driving buffer in parallel and being configured to delay an input signal by a respective amount of time, at least two of the delay paths being configured to delay the input signal by different amounts of time from each other.

16. The integrated circuit device of claim 15, wherein each of the plurality of delay paths includes:
a delay cell having a first input and a first output, the first input being connected to the input of the driving buffer and configured to delay the input signal by a respective amount of time; and
a driver having a second input and a second output, the second input being connected to the first output of the delay cell, and the second output being connected to the output of the driving buffer, the driver comprising a fin field-effect transistor ("FinFET") having a respective number of fingers,
wherein the numbers of fingers for the FinFETs in at least two of the drivers are different from each other.

17. The integrated circuit device of claim 15, wherein each of the plurality of delay paths includes:

a delay cell having a first input and a first output, the first input being connected to the input of the driving buffer and configured to delay the input signal by a respective amount of time; and a driver having a second input and a second output, the second input being connected to the first output of the delay cell, and the second output being connected to the output of the driving buffer, the driver being configured to provide at the second output of the driver a signal of a respective amplitude.

18. The integrated circuit device of claim 16, further comprising a substrate, and wherein:

the first integrated circuit device portion comprises a first semiconductor die, and the first plurality of semiconductor devices are formed on the first semiconductor die;

the second integrated circuit device portion comprises a second semiconductor die, and the second plurality of semiconductor devices are formed on the second semiconductor die;

the first and second semiconductor dies are disposed on top of the substrate, and at least a portion of the data communication path is disposed within the substrate.

19. A method of transmitting a signal, the method comprising:

receiving an input signal with a rising edge and a falling edge of digital data;

generating a plurality of signals, each with a rising edge and a falling edge of digital data and being a signal proportional to the received signal amplitude by a respective factor and delayed from the received input signal by a respective time delay, wherein the generating a plurality of signal comprises applying the input signal to a plurality of delay paths in parallel, each configured to delay the applied input signal by a respective amount of time; and;

combining the plurality of generated signals to generate an output signal; and transmitting the output signal over a data transmission line.

20. The method of claim 19, wherein the generating a plurality of signals further comprises:

adjusting the amount of time by which the input signal is delayed in at least one of the plurality of delay paths.

\* \* \* \* \*